(12) United States Patent
Zhou et al.

(10) Patent No.: US 10,756,039 B2
(45) Date of Patent: Aug. 25, 2020

(54) FLUXES EFFECTIVE IN SUPPRESSING NON-WET-OPEN AT BGA ASSEMBLY

(71) Applicant: Indium Corporation, Utica, NY (US)

(72) Inventors: Fengying Zhou, Suzhou (CN); Fen Chen, Suzhou (CN); Ning-Cheng Lee, New York, NY (US)

(73) Assignee: INDIUM CORPORATION, Utica, NY (US)

( * ) Notice: Subject to any disclaimer, the term of this patent is extended or adjusted under 35 U.S.C. 154(b) by 0 days.

(21) Appl. No.: 16/172,822

(22) Filed: Oct. 28, 2018

(65) Prior Publication Data

US 2019/0371752 A1 Dec. 5, 2019

(30) Foreign Application Priority Data

May 31, 2018 (CN) .......................... 2018 1 0553189

(51) Int. Cl.
| | | |
|---|---|---|
| *H01L 21/44* | (2006.01) | |
| *H01L 21/56* | (2006.01) | |
| *B23K 35/24* | (2006.01) | |
| *H05K 3/30* | (2006.01) | |
| *H01L 23/498* | (2006.01) | |

(Continued)

(52) U.S. Cl.
CPC .............. *H01L 24/11* (2013.01); *H01L 24/17* (2013.01); *H05K 3/3436* (2013.01); *H01L 2924/15311* (2013.01)

(58) Field of Classification Search
CPC .. B23K 3/0638; H05K 3/3436; H05K 3/3484; H05K 3/0035; H05K 3/1216; H05K 3/1225; H05K 3/3452; H05K 2203/0191; H05K 2203/043; H05K 2203/0557; H05K 2203/0568; Y02P 70/613
See application file for complete search history.

(56) References Cited

U.S. PATENT DOCUMENTS 6,367,150 B1 * 4/2002 Kirsten .............. B23K 35/3613
29/840
2002/0014703 A1 2/2002 Capote et al.
(Continued)

OTHER PUBLICATIONS

Amir et al., "The Challenges of Non Wet Open BGA Solder Defect", SMTAI proceedings, Oct. 2012, pp. 684-694.
(Continued)

*Primary Examiner* — Brian Turner
(74) *Attorney, Agent, or Firm* — Sheppard, Mullin, Richter & Hampton LLP

(57) ABSTRACT

The disclosure describes techniques for eliminating or reducing non-wet open (NWO) defect formation by using a low activity flux to prevent a solder paste from sticking to ball grid array (BGA) solder balls during reflow soldering. The low activity flux may be configured such that: i) it creates a barrier that prevents the solder paste from sticking to the solder balls of the BGA; and ii) it does not impede the formation of solder joints during reflow. In implementations, a solid coating of the low activity flux may be formed over balls of the BGA, and the BGA may then be bonded to a PCB during reflow. In implementations, the balls of a BGA may be dipped in a low-activity creamy or liquid flux prior to reflow. In some implementations, the flux may applied on a solder paste printed on pads of the PCB, followed by placement of a BGA.

13 Claims, 8 Drawing Sheets

(51) Int. Cl.
 *H01L 23/00* (2006.01)
 *H05K 3/34* (2006.01)

(56) References Cited

U.S. PATENT DOCUMENTS

| | | | | |
|---|---|---|---|---|
| 2003/0096453 | A1* | 5/2003 | Wang | H01L 21/563 |
| | | | | 438/108 |
| 2004/0082108 | A1* | 4/2004 | Thomas | H01L 23/49816 |
| | | | | 438/108 |
| 2004/0165362 | A1* | 8/2004 | Farnworth | H01L 24/02 |
| | | | | 361/764 |
| 2010/0313416 | A1* | 12/2010 | Meura | H01L 24/73 |
| | | | | 29/874 |
| 2012/0217290 | A1* | 8/2012 | Lee | B23K 35/3601 |
| | | | | 228/224 |
| 2013/0334291 | A1 | 12/2013 | Eom et al. | |
| 2014/0175639 | A1 | 6/2014 | Kim et al. | |
| 2014/0291834 | A1* | 10/2014 | Gandhi | H01L 24/81 |
| | | | | 257/737 |
| 2017/0077074 | A1* | 3/2017 | Shi | H01L 25/105 |

OTHER PUBLICATIONS

Fullerton, Jason, "The War on Soldering Defects under Area Array Packages: Head-in-Pillow and Non-Wet Open," SMT Magazine (Aug. 2015), pp. 12-21.

International Search Report and Written Opinion dated Nov. 19, 2019 for International Application No. PCT/US2019/034577, filed May 30, 2019.

Office Action dated Jun. 24, 2020 for Chinese Application No. 201810553189.5, filed May 31, 2018.

* cited by examiner

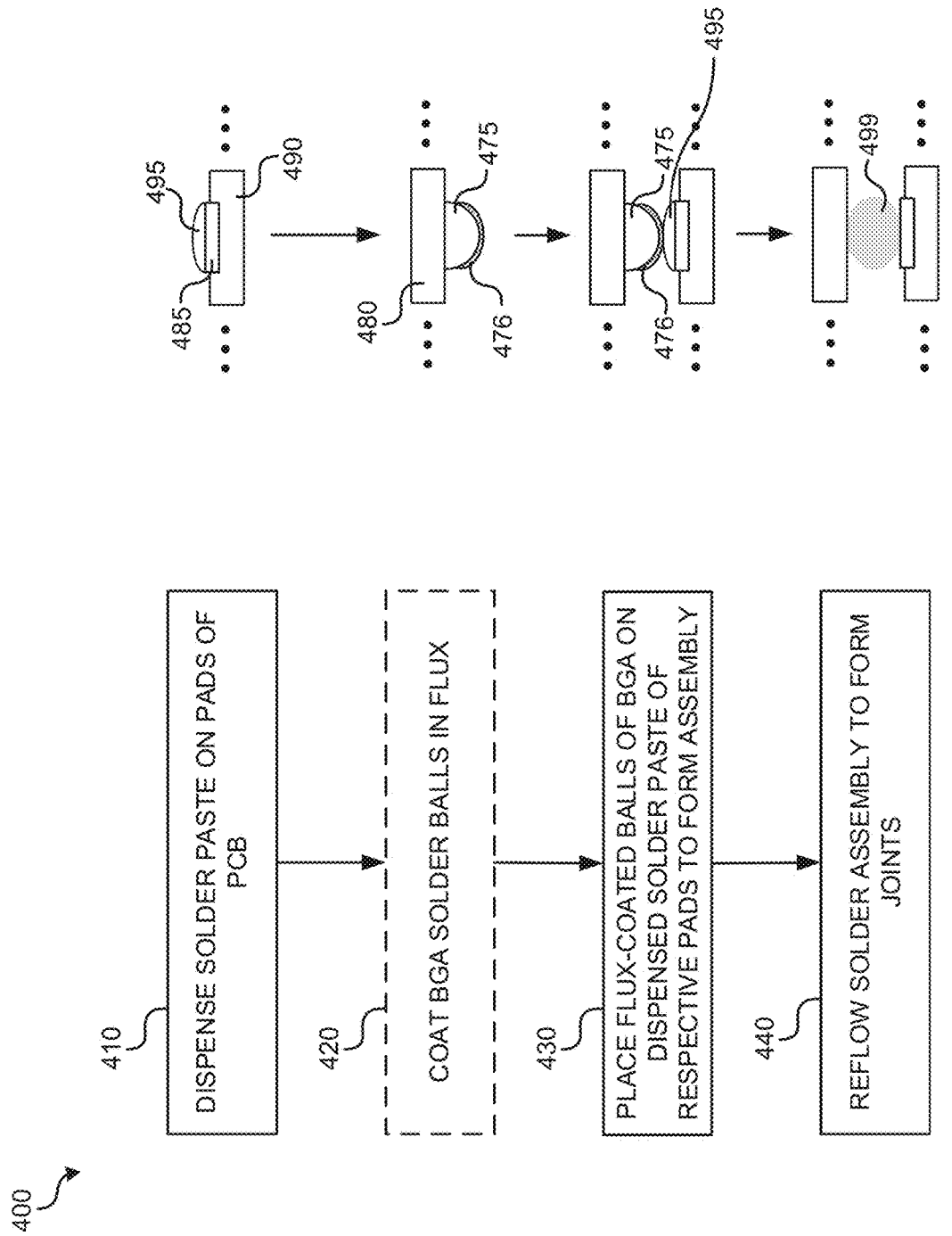

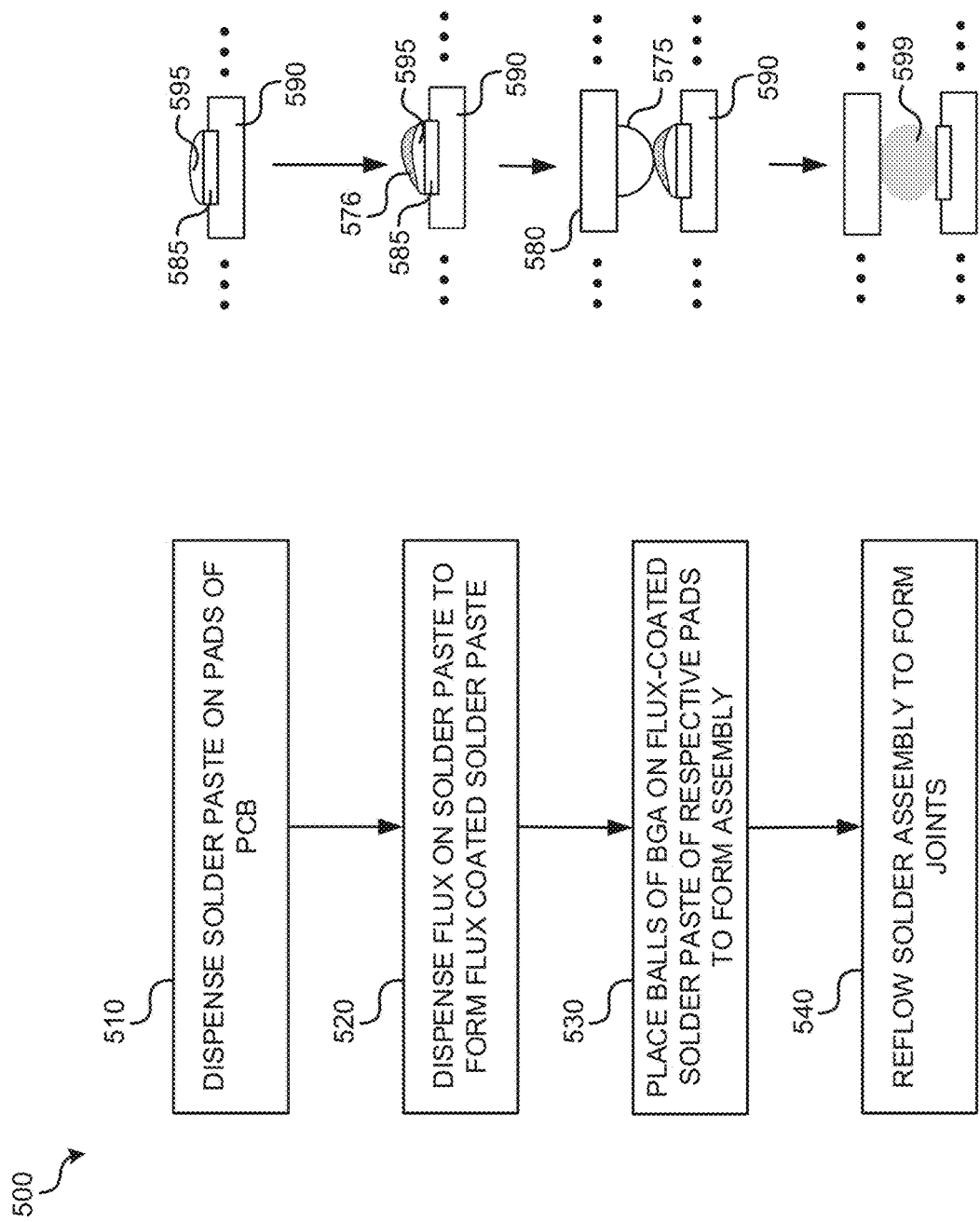

FLUXES EFFECTIVE IN SUPPRESSING NON-WET-OPEN AT BGA ASSEMBLY

CROSS REFERENCE TO RELATED APPLICATIONS

This application claims priority to Chinese Patent Application No. 201810553189.5, filed on May 31, 2018.

TECHNICAL FIELD

The present disclosure relates generally to ball grid arrays.

DESCRIPTION OF THE RELATED ART

A ball grid array (BGA) is a surface-mount package that may be used to permanently mount and electrically connect components on a surface of printed circuit boards (PCBs). In a BGA, balls (sometimes referred to as "bumps") of solder may be placed in a grid pattern on a substrate on an underside of the package. The PCB onto which the BGA is mounted may have a matching set of metal pads (e.g., copper pads) for receiving the solder balls to provide electrical interconnection.

With the continuing miniaturization of electronic components, the die of the BGA is getting thinner and the solder balls are getting smaller. Additionally, environmentally friendly manufacturing is driving the use of Pb-free solders, which increases the temperatures at which the BGA is processed to melt the solder balls during a bonding process. Due to a coefficient of thermal expansion (CTE) mismatch between the die and molding compound of the BGA, this is increasing thermal warpage during reflow processing.

These trends in the industry are increasing the challenges of board assembly and introducing additional defects into the reflow solder process. One defect that has increased in incidence (e.g., due to a CTE mismatch) is the formation of a non-wet-open (NWO) defect at the BGA. A NWO defect, sometimes referred to as "non wet," "lifted ball," "hanging ball," "ball on pad," or "ball on land," generally refers a solder joint defect whereby a BGA solder ball does not solder to a PCB pad (sometimes referred to as a land pad).

FIG. 1 illustrates a surface-mount technology (SMT) reflow soldering profile whereby a NWO defect develops. As shown, at stage 110, a solder ball 101 of a BGA is placed on a solder paste 102 printed over a PCB pad 111. Following stage 110, the assembly is heated. As the temperature of the assembly is heated, the shape of the BGA may begin to warp (e.g., due to a mismatch of the CTEs between the die and molding compound of the BGA). Additionally, the shape of the PCB may be begin to warp. As illustrated by stage 120, this thermal warpage may cause the solder paste 102 to stretch and lift up from PCB pad 111, creating a gap 112 and leaving the PCB pad 111 with little to no solder paste 102. For example, as the corners and edges of the BGA warp away from the surface of the PCB, solder paste deposits may adhere to the solder ball and be lifted off the pad. This lifting may continue at a temperature range of about 160 to 190° C., below the melting temperature of the solder paste 102. This lifting of paste 102 may subsequently cause a NWO defect.

At stage 130, during reflow, the lifted paste may melt and coalesce with the melted solder ball to create mass 115 which is in the form of a larger solder ball. Additionally the exposed PCB pad 111 may exposed to a high reflow temperature, causing it to grow oxides that impede wetting. If the solder paste completely coalesces with the solder ball before the package collapses back down, it may not wet to PCB pad 111. When the assembly cools down, the BGA collapses, and the larger solder ball may simply rest on PCB pad 111 without a physical connection, causing a NWO solder joint defect that has no electrical continuity (stage 140).

BRIEF SUMMARY OF EMBODIMENTS

Systems and methods are described for eliminating or reducing non-wet open (NWO) defect formation by using a low activity flux to prevent a solder paste from sticking to ball grid array (BGA) solder balls during reflow soldering.

In one embodiment, a method includes: dispensing solder paste on a pad of a printed circuit board (PCB); mounting a ball grid array (BGA) on the PCB to form an assembly, where mounting the BGA on the PCB includes mounting a flux coated solder ball of the BGA on the dispensed solder paste, where the flux is a low activity flux; and reflow soldering the assembly to form a solder joint, where during reflow, the low activity flux coating the solder ball prevents the formation of a non-wet open between the solder joint and the pad, where the solder paste reflows into the solder ball to form the solder joint. During reflow, a flux of the solder paste dispensed on the PCB may penetrate through the low activity flux to remove oxides and promote wetting on the solder ball to form the solder joint.

In implementations, the method further includes: coating the solder ball of the BGA in the low activity flux to form the flux coated solder ball prior to mounting the BGA on the PCB. In implementations, coating the solder ball of the BGA in the low activity flux includes: dipping the solder ball in a bath of the low activity flux; spraying the low activity flux on the solder ball; or dispensing the low activity flux on the solder ball.

In implementations, coating the solder ball of the BGA in the low activity flux further includes: curing the low activity flux to form a solid coating of the flux over the solder ball.

In implementations, coating the solder ball of the BGA in the low activity flux includes: placing the BGA on a tray, the tray including an opening at a bottom surface exposing the solder ball; and dipping the exposed solder ball of the BGA placed on the tray in a liquid or cream of the low activity flux.

In implementations, curing the low activity flux to form the solid coating of the flux comprises baking the BGA in an oven at a temperature between 140° C. and 160° C.

In implementations, the low activity flux is a no-clean flux and the solder paste is a no-clean solder paste. In implementations where the low activity flux is a no-clean flux, it may include: 15 to 85 wt % of solvents; 10 to 90 wt % resin; and 0.1 to 10 wt % of a thickening agent. In particular implementations, the low activity flux consists essentially of: 30 to 40 wt % of butyl carbitol; 58 to 68 wt % of resin; and 1 to 3 wt % of a thickening agent.

In implementations, the low activity flux is a water soluble flux, and the solder paste is a water soluble solder paste. In implementations where the low activity flux is a water soluble flux, the low activity flux may include: 15 to 85 wt % of solvents; 10 to 70 wt % of tetrakis(2-hydroxypropyl)ethylenediamine; 0.1 to 30 wt % of modified polyethylene glycol ether; 0.1 to 20% wt % of a water soluble polymer; and 0.1 to 10 wt % of a thickening agent. In particular implementations, the low activity flux consists essentially of: 20 to 30 wt % of butyl carbitol; 30 to 40 wt % of tetrakis(2-hydroxypropyl)ethylenediamine; 20 to 30 wt % of modified polyethylene glycol ether; 6 to 12 wt % of a water soluble polymer; and 3 to 6 wt % of a thickening agent.

In one embodiment, a method includes: dispensing solder paste on a pad of a printed circuit board (PCB); dispensing a low activity flux on the solder paste; mounting a ball grid array (BGA) on the PCB to form an assembly, where mounting the BGA on the PCB includes mounting a solder ball of the BGA on the low activity flux dispensed over the solder paste; and reflow soldering the assembly to form a solder joint, where during reflow, the low activity flux dispensed over the solder paste prevents the formation of a non-wet open between the solder joint and the pad, where the solder paste reflows into the solder ball to form the solder joint. During reflow, a flux of the solder paste dispensed on the PCB penetrates through the low activity flux to remove oxides and promote wetting on the solder ball to form the solder joint.

In one embodiment, a ball grid array (BGA) includes: a die; and a substrate including an array of solder balls electrically coupled to the die, where each of the solder balls of the array is coated in a solid coating of a low activity flux. During reflow soldering of the BGA to a PCB, the low activity flux coating each of the solder balls may prevent the formation of non-wet open of a solder joint formed by reflow soldering the solder ball to a solder paste dispensed on a pad of the PCB.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The technology disclosed herein, in accordance with one or more various embodiments, is described in detail with reference to the included figures. The figures are provided for purposes of illustration only and merely depict example implementations. Furthermore, it should be noted that for clarity and ease of illustration, the elements in the figures have not necessarily been drawn to scale.

FIG. 4A is an operational flow diagram illustrating an example method of bonding a BGA with low activity flux coated solder balls to a PCB, in accordance with implementations.

FIG. 4B illustrates a solder ball of an example BGA and a pad of an example PCB at various stages of the method of FIG. 4A.

FIG. 5A is an operational flow diagram illustrating an example method of bonding a BGA to a PCB by dispensing a low activity flux on a solder paste dispensed on the PCB pads, in accordance with implementations.

FIG. 5B illustrates a solder ball of an example BGA and a pad of an example PCB at various stages of the method of FIG. 5A.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

NWO defects have been ailing the electronics and semiconductor industries for many years. As summarized above, the main cause of NWO is the lifting of the solder paste from the PCB pads during reflow. This stage may occur when thermal warpage of the BGA is still fairly low. Some attempts have been made to develop specialty solder pastes to reduce the NWO defect. The success of these attempts has been limited. Although solder paste formulations can play an important role in regulating NWO defect formation, these pastes by themselves cannot overcome the NWO defect when thermal warpage is large. Other attempts to address NWO defects, including printing more solder paste on PCB pads (e.g., overprinting) and/or changing the reflow profile, have provided little success. For example, the industry has investigated low temperature soldering as an option to reduce thermal warpage that causes NWO defects. However, using lower melting temperature solders to form joints may compromise solder joint reliability.

To this end, embodiments described herein are directed to eliminating or reducing NWO defect formation by using a low activity flux to prevent a solder paste from sticking to BGA solder balls during reflow soldering. The low activity flux may be configured such that: i) it creates a barrier that prevents the solder paste from sticking to the solder balls of the BGA; and ii) it does not impede the formation of solder joints during reflow. In some implementations, a solid coating of the low activity flux may be formed over balls of the BGA, and the BGA may then be bonded to a PCB during reflow. In some implementations, the balls of a BGA may be dipped in a low-activity creamy or liquid flux prior to reflow. In some implementations, the flux may applied on the printed solder paste, followed by placement of a BGA. These and other implementations are further described below.

Figure 1:
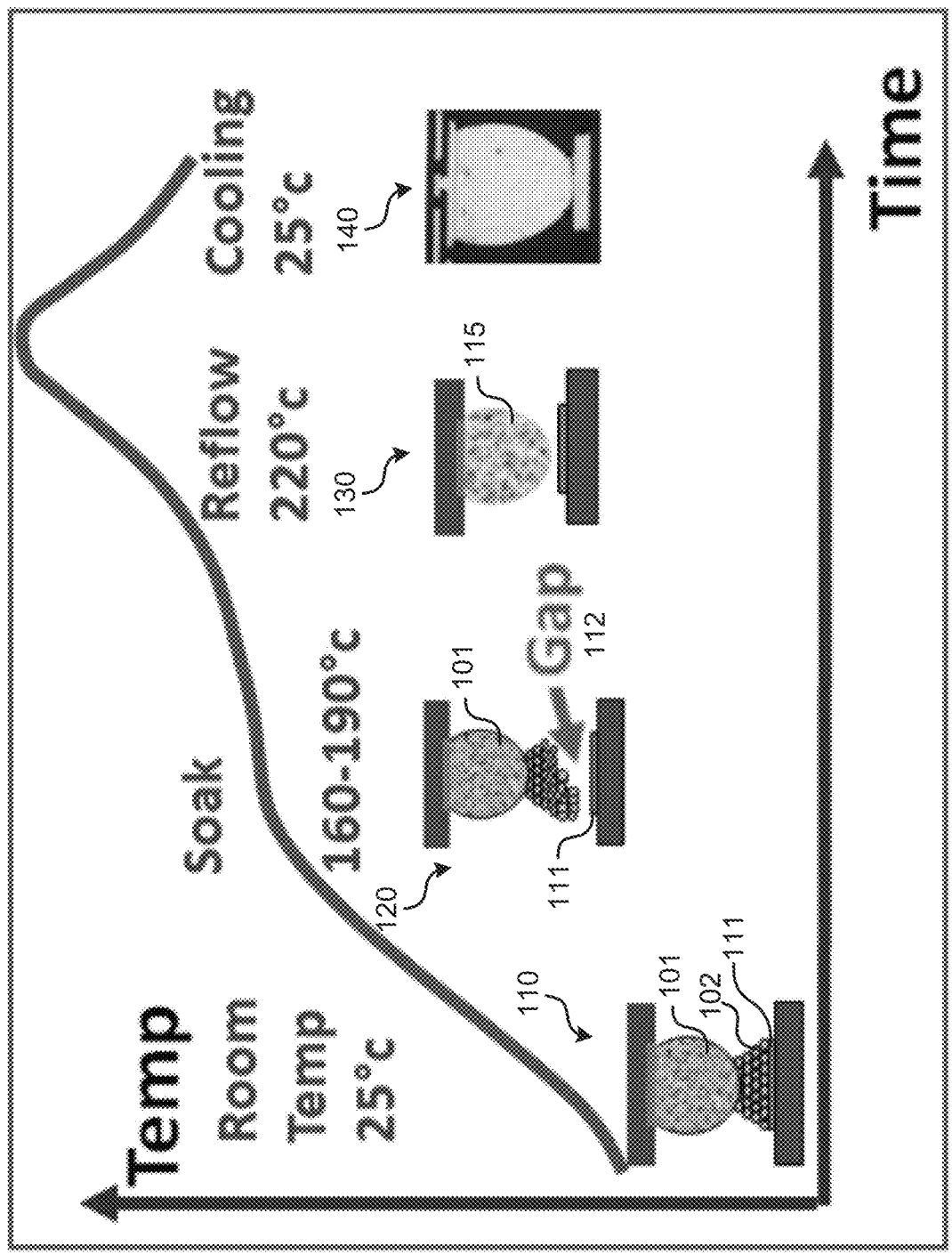
FIG. 1 illustrates a SMT reflow soldering profile whereby a NWO defect develops.
Figure 2:
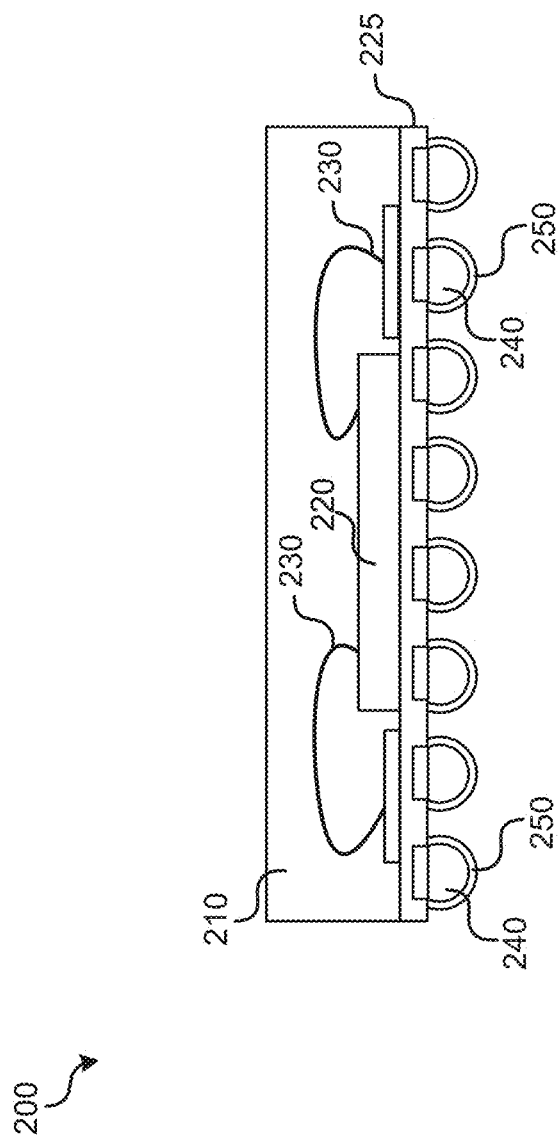
FIG. 2 illustrates an example BGA with which the technology disclosed herein may be implemented.

FIG. 2 illustrates an example BGA 200 with which the technology disclosed herein may be implemented. In this example, BGA 200 is illustrated and described as a plastic ball grid array (PBGA), but it should be appreciated that embodiments may be implemented using a ceramic ball grid array (CBGA), a tape ball grid array (TBGA), a ceramic column grid array (CCGA), or other suitable BGA type. As illustrated, BGA 200 includes a molding compound 210, a die 220, wire bonds 230, a substrate 225, and solder balls 240. Die 220 is wire bonded to a top surface of substrate 225 by wire bonds 230 and overmolded with a molding compound 210 (e.g., a plastic such as an epoxy based plastic). Attached to a bottom side of substrate 225 is an array of solder balls 240. Each of the solder balls in this example is coupled to a respective pad 235 that may couple to an interconnect (not shown) that electrically couples to die 200. In this manner, electrical signals may be conducted between the die 220 and a PCB onto which BGA 200 is placed.

In example BGA 200, a solid coating of a low activity flux 250 has been formed over each solder ball 240. During reflow soldering of BGA 200 to a PCB, because of its low activity, flux 250 may act as a barrier that prevents a solder paste deposited on a pad of the PCB from sticking to and lifting up with solder ball. As a result, the solder paste may stay on a PCB pad (and subsequently reflow into the solder ball), thereby preventing an NWO defect from forming. Additionally, the coating of flux 250 may be formulated such that it does not impede the formation of a solder joint during reflow. At reflow, a flux of a solder paste on the PCB pad may penetrate through the barrier of flux 250 and remove oxides and promote wetting on solder ball 240 to form a solder joint.

In implementations, low activity flux 250 may be a "no-clean" flux whose flux residue after reflow, may not need to be cleaned from the PCB to ensure reliability. In such implementations, flux 250 may comprise 15 to 85 wt % solvents (e.g., butyl carbitol), 10 to 90 wt % resin, and 0.1 to 10 wt % of a thickening agent. In particular implementations as a no-clean flux, flux 250 may comprise 30 to 40 wt % of butyl carbitol, 58 to 68 wt % of resin, and 1 to 3 wt % of thickener.

In implementations, low activity flux 250 may be a water soluble flux. In such implementations, flux 250 may comprise 15 to 85 wt % of solvents (e.g., butyl carbitol), 10 to 70 wt % tetrakis(2-hydroxypropyl)ethylenediamine (QUADROL) or derivatives thereof, 0.1 to 30 wt % of modified polyethylene glycol ether (LUTRON HF3), 0.1 to 20 wt % of water soluble polymers (e.g., polyvinylpyrrolidone (PVP), Polyethylene glycol (PEG) 1000, etc.), and 0.1 to 10 wt % of a thickening agent. In particular implementations as a water soluble flux, flux 250 may comprise 20 to 30 wt % of butyl carbitol, 30 to 40 wt % of QUADROL, 20 to 30 wt % of modified polyethylene glycol ether, 3 to 6 wt % of PVP, 3 to 6 wt % of PEG 1000, and 3 to 6 wt % of thickener.

Figures 3A, 3B:
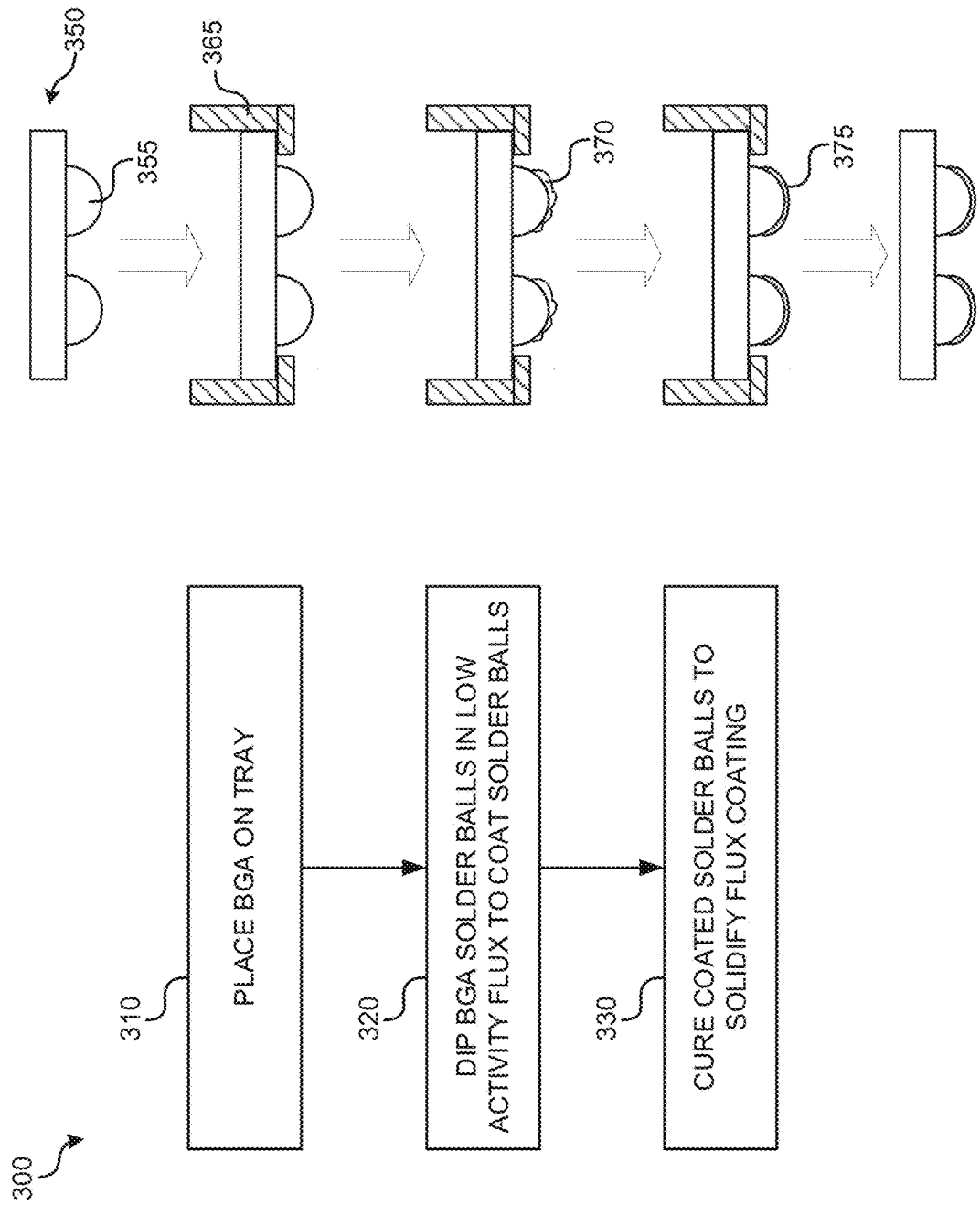
FIG. 3A is an operational flow diagram illustrating an example method of forming a solid coating of flux over solder balls of a BGA, in accordance with implementations.
FIG. 3B, which illustrates a BGA, including solder balls, at various stages of the method of FIG. 3A.

FIG. 3A is an operational flow diagram illustrating an example method 300 of forming a solid coating of flux over solder balls of a BGA, in accordance with implementations. Method 300 will be described with reference to FIG. 3B, which illustrates a BGA 350, including solder balls 355, at various stages of method 300. At operation 310, the BGA may be placed on a tray 365 including an opening at the bottom for exposing solder balls 355. At operation 320, the exposed solder balls of the BGA placed on the tray may be dipped in a liquid or cream 370 of the low activity flux to coat the solder balls in the flux. After coating the surface of solder balls 355 with a cream or liquid 370 of the flux, at operation 330 the flux coating may be cured to solidify the flux to form a solid flux coating 375. For example, depending on the composition of the flux, the BGA 350 may be placed in an oven (e.g., a reflow oven) at a temperature of about 140 C to 160 C for 4 to 6 minutes. The oven temperature may be chosen to be substantially below the solidus temperature of the balls 355 of the BGA 350.

Although method 300 has been described with reference to forming a solid coating of flux over solder balls of a BGA using a dipping process, it should be noted that other techniques may be used to coat the solder balls in a low activity flux prior to curing. For example, in some implementations the low activity flux may be jetted or otherwise dispensed on the solder balls of the BGA prior to curing.

FIG. 4A is an operational flow diagram illustrating an example method 400 of bonding a BGA with low activity flux coated solder balls to a PCB, in accordance with implementations. Method 400 will be described with reference to FIG. 4B, which illustrates a solder ball 475 of an example BGA 480 and a pad 485 of an example PCB 490 at various stages of method 400. At operation 410, solder paste may be dispensed on pads 485 of the PCB. For example, a solder paste 495 may be printed on each pad 485 of the PCB 490. The printed solder paste may be a no-clean solder paste or a water soluble solder paste. In some implementations, the PCB 490 may be a component of a second BGA that is attached to BGA 480 (e.g., as part of a package on package (POP) method). In some implementations, the solder paste 495 may be an SnAgCu ("SAC") solder paste including an SAC solder (e.g., SAC305 or SAC387) and flux. In some implementations, solder balls 475 may be SAC solder balls.

In implementations where a solid coating of flux has not been formed over solder balls of the BGA prior to assembly (e.g., as described above with reference to method 300), at optional operation 420, the solder balls of the BGA may be coated in low activity flux as described herein. For example, the solder balls 475 of the BGA 480 may be dipped in a low-activity creamy or liquid flux 476. In such implementations, the flux that is coated on the solder balls of the BGA may not be cured prior to placement of the BGA on the PCB (e.g., prior to operation 430).

In implementations where the solder paste deposited on the pads of the PCB is a no-clean solder paste, the flux coating the solder ball may be a no-clean flux. In implementations where the solder paste deposited on the pads of the PCB is a water soluble solder paste, the flux coating the solder ball may be a water soluble flux.

At operation 430, the flux coated solder balls 475 of the BGA 480 may each be placed on a dispensed solder paste 495 of a respective land pad 485 of the PCB 490 to form an assembly. At operation 440, the assembly may be reflow soldered to form solder joints 499. During reflow, the flux 476 coating the solder balls 475 may be configured to act as a barrier that prevents the solder paste 495 deposited on a pad 485 of the PCB 490 from sticking to and lifting up with the solder ball 475 (e.g., during thermal warpage of the BGA). As a result, the solder paste 495 may stay on a PCB pad (e.g. pad 485) and subsequently reflow into the solder ball 475 when the liquid solder ball collapses back onto the liquid solder paste (e.g., during cooling, when thermal warpage lessens). During reflow, a flux of a solder paste on the PCB pad may penetrate through the barrier of low activity flux 476 and remove oxides and promote wetting on solder ball 475 to form a solder joint 499.

FIG. 5A is an operational flow diagram illustrating an example method 500 of bonding a BGA to a PCB by dispensing a low activity flux on a solder paste dispensed on the PCB pads, in accordance with implementations. Method 500 will be described with reference to FIG. 5B, which illustrates a solder ball 575 of an example BGA 580 and a pad 585 of an example PCB 590 at various stages of method 500.

At operation 510, solder paste 595 may be dispensed on pads of a PCB 590. For example, a solder paste 595 may be printed on each pad 585 of the PCB 590. The printed solder paste may be a no-clean solder paste or a water soluble solder paste. In some implementations, the PCB 590 may be a component of a second BGA that is attached to BGA 580 (e.g., as part of a package on package (POP) method).

At operation 520, a low activity flux 576 may dispensed on the solder paste 595 to form a flux coated solder paste. For example, the low activity flux 576 may be sprayed onto the solder paste 595. In implementations where the solder paste 595 deposited on the pads 585 of the PCB 590 is a no-clean solder paste, the flux 576 coating the solder paste 595 may be a no-clean flux. In implementations where the solder paste 595 deposited on the pads 585 of the PCB 590 is a water soluble solder paste, the flux 576 coating the solder paste 595 may be a water soluble flux.

At operation 530, solder balls 575 of a BGA 580 (in this example, without a flux coating) may each be placed on the flux-coated solder paste on a respective land pad 585 of the PCB 590 to form an assembly. At operation 540, the assembly may be reflow soldered to form solder joints 599. During reflow, the flux 576 coating the solder paste 595 may be configured to act as a barrier that prevents the solder paste 595 deposited on a pad 585 of the PCB 590 from sticking to and lifting up with the solder ball 575 (e.g., during thermal warpage of the BGA). As a result, the solder paste 595 may stay on a PCB pad (e.g. pad 585) and subsequently reflow into the solder ball 575 when the solder ball collapses back onto the solder paste. During reflow, a flux of a solder paste on the PCB pad may penetrate through the barrier of low activity flux 576 and remove oxides and promote wetting on solder ball 575 to form a solder joint 599.

Experimental Results

Figure 6:
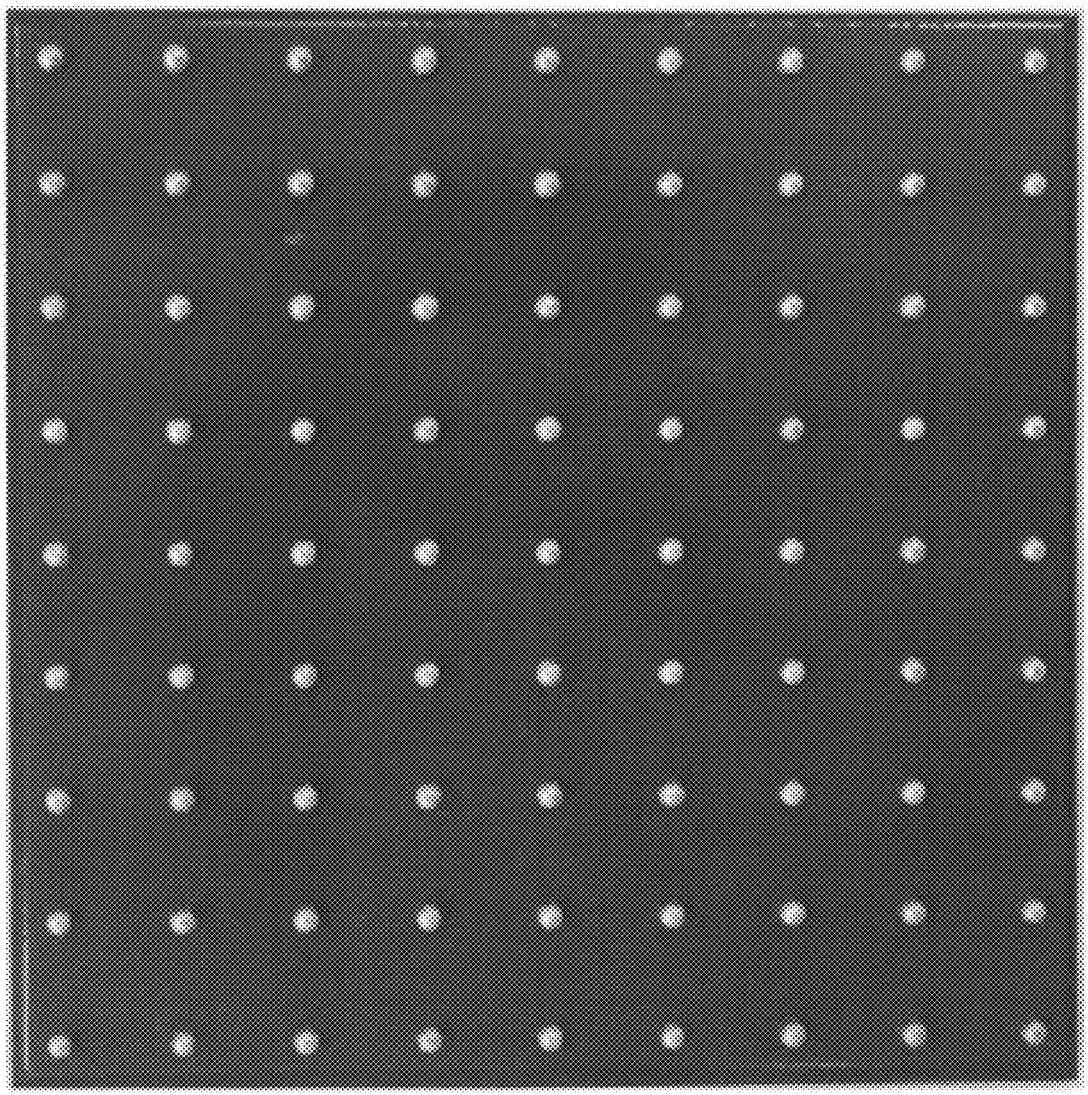
FIG. 6 is a photograph showing a BGA test board including a 9×9 array of solder balls.

FIG. 6 is a photograph showing a BGA test board including a 9×9 array of solder balls. Experiments were conducted to check for NWO defects using this BGA test board including the 9×9 array of solder balls coated with a low activity flux in accordance with implementations. Tests were conducted with three versions of the BGA test board. One BGA test board was dipped in the low-activity flux and then cured to form a solid coating of the low-activity flux over the solder balls (e.g., as described above with reference to FIG. 3). Another BGA test board was dipped in the low-activity flux but not cured prior to testing. In both cases, the low activity flux that was used was a no-clean flux having 35 wt % butyl carbitol, 63 wt % resin, and 2 wt % thickener. In both cases, the solder balls of the BGA test boards were dipped in a 0.25 mm thick flux coating (about 50% of the height of the solder balls). The third version of the BGA test board had no flux coating on the solder balls.

During testing, two different halogen-free no-clean type solder pastes, including SAC305 solder powders, were considered. The tested solder pastes were printed on the pads of each tested PCB. Each BGA test board (i.e., (i) solder balls dipped in flux, (ii) solid coating of flux formed over solder balls, or (iii) flux not applied to solder balls) was placed onto the PCB pads with the printed paste to form a BGA/PCB assembly, and the BGA/PCB assembly was baked in a standalone baking oven for 8 minutes at 180° C., below the melting temperature of the solder paste and solder balls. The BGA/PCB assembly was then cooled to room temperature. After cooling to room temperature, the BGA test board was pulled off the PCB, and the PCB land pads were inspected under a microscope for NWO symptoms. PCB land pads that retained at least 70% of the solder paste on the pad were considered to be good at suppressing NWO defects.

Table 1, below, shows the results of testing.

TABLE 1

NWO Screening Test results, using BGA with 81 balls

| Printed paste | BGA Ball (81 balls per BGA) | Bake time | No. of pads with <70% paste on pad | Average pads with NWO symptom per BGA | Average pad % per BGA showing NWO symptom |
|---|---|---|---|---|---|
| Paste A | NO dipping or solid coating | 8 mins (180 ± 5 C.) | 49, 81, 79, 38 | 61.8 | 76.2 |
|  | Dipping with low-activity flux |  | 5, 11, 11, 14 | 10.3 | 12.7 |
|  | Solid coating of low-activity flux |  | 6, 9, 14, 1 | 7.5 | 9.3 |
| Paste B | NO dipping or solid coating | 8 mins (180 ± 5 C.) | 8, 9, 18, 1 | 9 | 11.1% |
|  | Dipping with low-activity flux |  | 0, 0, 0, 0, 0 | 0 | 0 |
|  | Solid coating of low-activity flux |  | 0, 0, 0, 0, 0 | 0 | 0 |

As shown, on average, the PCB pads coated with solder paste A exhibited a very high number of NWO defects (76.2% of the pads, on average, for the four tested PCBs) when no low activity flux barrier was utilized (e.g., no dipping of the BGA solder balls in the low-activity flux). By contrast, the number of NWO defects, on average, were greatly reduced when using BGA test boards having solder balls dipped in the low-activity flux (12.7% of the pads, on average) or solder balls dipped in the low-activity flux that was cured to form a solid coating (9.3% of the pads, on average).

On average, the PCB pads coated with solder paste B exhibited a lower number of NWO defects (11.1% of the pads, on average, for the four tested PCBs) as compared with paste A when no low activity flux barrier was utilized. When the solder balls of the BGA test boards were dipped in the low-activity flux, NWO defects were entirely eliminated when testing with solder paste B.

Figure 7A:
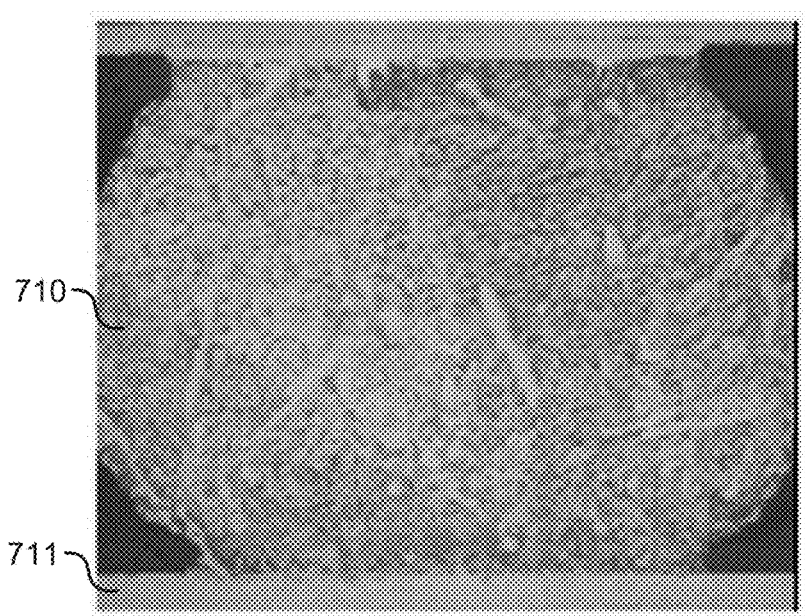
FIG. 7A is a micrograph showing a normal solder joint formed between a BGA and PCB without an NWO defect at a PCB land.
Figure 7B:
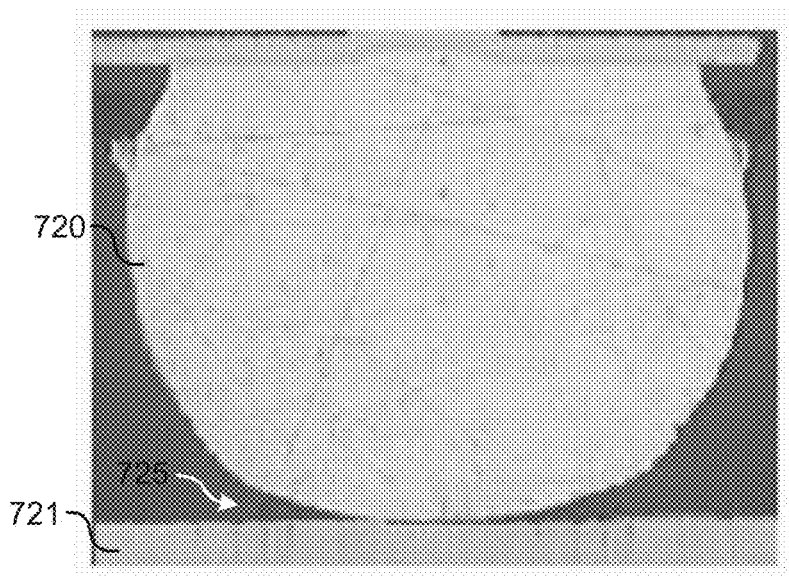
FIG. 7B is a micrograph showing a solder joint formed between a BGA and PCB with a NWO defect, including a gap at an interface between the PCB land and joint.
Figure 7C:
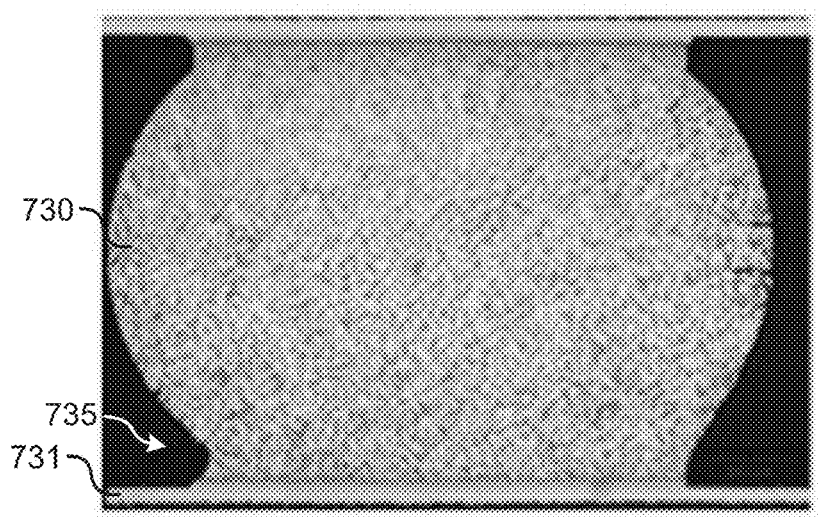
FIG. 7C is a micrograph showing a solder joint formed between a BGA and PCB without an NWO defect at PCB land, using a low activity flux to suppress NWO defect formation.

FIG. 7A is a micrograph showing a normal solder joint 710 formed between a BGA and PCB without an NWO defect at PCB land 711. No low activity flux barrier was used during reflow soldering in FIG. 7A. FIG. 7B is a micrograph showing a solder joint 720 formed between a BGA and PCB with a NWO defect, including a gap at interface 725 between PCB land 721 and joint 720. No low activity flux barrier was used during reflow soldering in FIG. 7B. FIG. 7C is a micrograph showing a solder joint 730 formed between a BGA and PCB without an NWO defect at PCB land 731. A low activity flux barrier, in accordance with implementations, was used during reflow soldering in FIG. 7C to suppress NWO defect formation. As illustrated, connection interface 735 between solder joint 730 and PCB land 730 is similar to that of normal solder joint 710.

Figure 8A:
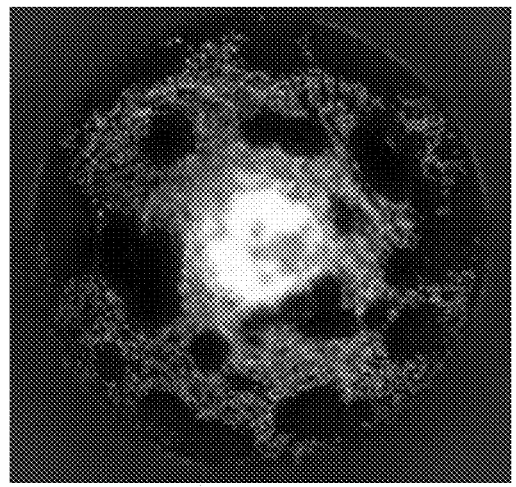
FIG. 8A illustrates a BGA solder ball without a flux coating.
Figure 8B:
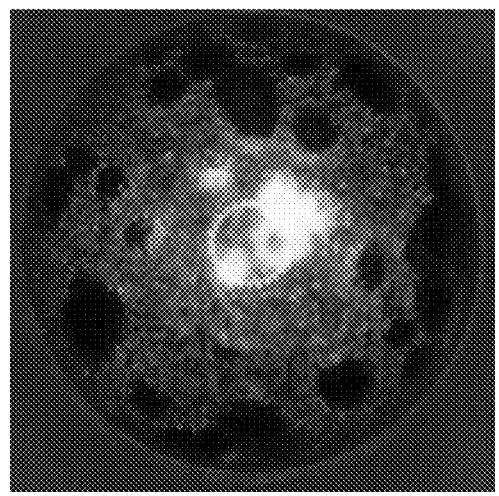
FIG. 8B illustrates a BGA solder ball after dipping it in a low activity creamy flux, in accordance with implementations.
Figure 8C:
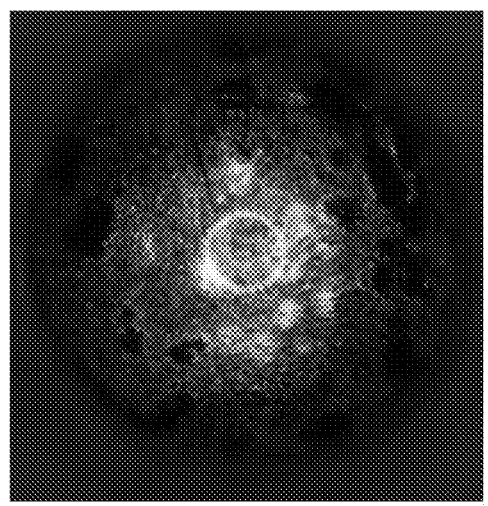
FIG. 8C illustrates a BGA solder ball after forming a solid coating of a low activity flux over it, in accordance with implementations.

FIG. 8A illustrates a BGA solder ball without a flux coating. FIG. 8B illustrates a BGA solder ball after dipping it in a low activity creamy flux, in accordance with implementations. FIG. 8C illustrates a BGA solder ball after forming a solid coating of a low activity flux over it, in accordance with implementations.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A method, comprising:
   dispensing solder paste on a pad of a printed circuit board (PCB);
   mounting a ball grid array (BGA) on the PCB to form an assembly, the BGA comprising a solder ball that is coated with a flux, wherein mounting the BGA on the PCB comprises mounting the solder ball coated with the flux on the dispensed solder paste; and
   reflow soldering the assembly at a peak temperature of greater than 180° C. to form a solder joint directly coupled to the pad, wherein during reflow, the BGA or PCB thermally warps, causing the solder ball coated with flux to lift away from the pad, wherein the flux acts as a barrier that prevents the solder paste from sticking to the solder ball and lifting away from the pad with the solder ball, wherein after lifting away, the solder ball collapses back onto the solder paste and the solder paste reflows into the solder ball to form the solder joint.

2. The method of claim 1, further comprising: coating the solder ball of the BGA in the flux prior to mounting the BGA on the PCB.

3. The method of claim 2, wherein coating the solder ball of the BGA in the flux comprises:
   dipping the solder ball in a bath of the flux;
   spraying the flux on the solder ball; or
   dispensing the flux on the solder ball.

4. The method of claim 3, wherein coating the solder ball of the BGA in the flux further comprises: curing the flux to form a solid coating of the flux over the solder ball.

5. The method of claim 4, wherein coating the solder ball of the BGA in the flux comprises:
   placing the BGA on a tray, the tray comprising an opening at a bottom surface exposing the solder ball; and
   dipping the exposed solder ball of the BGA placed on the tray in a liquid or cream of the flux.

6. The method of claim 4, wherein curing the flux to form the solid coating of the flux comprises baking the BGA in an oven at a temperature between 140° C. and 160° C.

7. The method of claim 1, wherein the flux is a no-clean flux and wherein the solder paste is a no-clean solder paste.

8. The method of claim 7, wherein the flux consists essentially of:
15 to 85 wt % of solvents;
10 to 90 wt % resin; and
0.1 to 10 wt % of a thickening agent.

9. The method of claim 8, wherein the flux consists essentially of:
30 to 40 wt % of butyl carbitol;
58 to 68 wt % of resin; and
1 to 3 wt % of a thickening agent.

10. The method of claim 1, wherein the flux is a water soluble flux, and wherein the solder paste is a water soluble solder paste.

11. The method of claim 1, wherein during reflow, a flux of the solder paste dispensed on the PCB penetrates through the flux coating the solder ball to remove oxides and promote wetting on the solder ball to form the solder joint.

12. A method, comprising:
dispensing solder paste on a pad of a printed circuit board (PCB);
mounting a ball grid array (BGA) on the PCB to form an assembly, the BGA comprising a solder ball that is coated with a flux, wherein mounting the BGA on the PCB comprises mounting the solder ball coated with the flux on the dispensed solder paste; and
reflow soldering the assembly to form a solder joint, wherein during reflow, the flux prevents the formation of a non-wet open between the solder joint and the pad, wherein the solder paste reflows into the solder ball to form the solder joint, wherein the flux is a water soluble flux, wherein the solder paste is a water soluble solder paste, and wherein the flux consists essentially of:
15 to 85 wt % of solvents;
10 to 70 wt % of tetrakis(2-hydroxypropyl)ethylenediamine;
0.1 to 30 wt % of modified polyethylene glycol ether;
0.1 to 20% wt % of a water soluble polymer; and
0.1 to 10 wt % of a thickening agent.

13. A method, comprising:
dispensing solder paste on a pad of a printed circuit board (PCB);
mounting a ball grid array (BGA) on the PCB to form an assembly, the BGA comprising a solder ball that is coated with a flux, wherein mounting the BGA on the PCB comprises mounting the solder ball coated with the flux on the dispensed solder paste; and
reflow soldering the assembly to form a solder joint, wherein during reflow, the flux prevents the formation of a non-wet open between the solder joint and the pad, wherein the solder paste reflows into the solder ball to form the solder joint, wherein the flux is a water soluble flux, wherein the solder paste is a water soluble solder paste, and wherein the flux consists essentially of:
20 to 30 wt % of butyl carbitol;
30 to 40 wt % of tetrakis(2-hydroxypropyl)ethylenediamine;
20 to 30 wt % of modified polyethylene glycol ether;
6 to 12 wt % of a water soluble polymer; and
3 to 6 wt % of a thickening agent.

* * * * *